US008397015B2

(12) United States Patent
Ootsuka (10) Patent No.: US 8,397,015 B2
(45) Date of Patent: Mar. 12, 2013

(54) MEMORY CONTROLLER, SEMICONDUCTOR RECORDING DEVICE, AND METHOD FOR NOTIFYING THE NUMBER OF TIMES OF REWRITING

(75) Inventor: Takeshi Ootsuka, Hyogo (JP)

(73) Assignee: Panasonic Corporation, Osaka (JP)

( * ) Notice: Subject to any disclaimer, the term of this patent is extended or adjusted under 35 U.S.C. 154(b) by 758 days.

(21) Appl. No.: 12/598,957

(22) PCT Filed: Apr. 18, 2008

(86) PCT No.: PCT/JP2008/001025
§ 371 (c)(1),
(2), (4) Date: Nov. 5, 2009

(87) PCT Pub. No.: WO2008/139689
PCT Pub. Date: Nov. 20, 2008

(65) Prior Publication Data
US 2010/0138593 A1    Jun. 3, 2010

(30) Foreign Application Priority Data
May 10, 2007    (JP) ................................. 2007-125921

(51) Int. Cl.
*G06F 12/00*    (2006.01)
*G06F 13/00*    (2006.01)
*G06F 13/28*    (2006.01)

(52) U.S. Cl. ........ 711/103; 711/173; 711/154; 711/202; 711/221; 365/185.33

(58) Field of Classification Search ................... 711/103
See application file for complete search history.

(56) References Cited

U.S. PATENT DOCUMENTS 5,740,936 A * 4/1998 Nash .............................. 220/3.3
5,841,669 A * 11/1998 Purvis et al. ................... 702/179
6,601,132 B2 * 7/2003 Nomura et al. ............... 711/103

(Continued)

FOREIGN PATENT DOCUMENTS

JP    06-302194    10/1994
JP    2003-022682    1/2003

(Continued)

OTHER PUBLICATIONS

International Search Report for corresponding application No. PCT/JP2008/001025 dated Jul. 8, 2008.

(Continued)

*Primary Examiner* — Matthew Bradley
*Assistant Examiner* — Prasith Thammavong
(74) *Attorney, Agent, or Firm* — Renner, Otto, Boisselle & Sklar, LLP (57) ABSTRACT

User data transferred from a host apparatus and a first information table 35 indicating correspondence between a logical address and a physical address are recorded in a first region of a flash memory 20. A second information table 38 composed of the physical block address storing the first information table 35 and the number of times of update of the physical block for recording the first information table from the time of manufacturing is recorded in a second region of the flash memory 20. The physical blocks of the first and the second regions are recorded independently from each other in a rotational manner. According to the recording of the second information table, the total number of times of rewriting of the first region is converted. This can suppress the number of times of rewriting of the second region and improve reliability of the number of times of update of the first information table from the time of manufacturing, the number being recorded in the second region.

15 Claims, 8 Drawing Sheets

U.S. PATENT DOCUMENTS

| | | |
|---|---|---|
| 7,451,266 B2 * 11/2008 | Shinagawa et al. | 711/103 |
| 7,461,198 B2 * 12/2008 | Tsai et al. | 711/103 |
| 2006/0265545 A1 11/2006 | Entani | |

FOREIGN PATENT DOCUMENTS

| JP | 2005-284659 | 10/2005 |
|---|---|---|

OTHER PUBLICATIONS

English translation of the International Preliminary Report on Patentability for corresponding application No. PCT/JP2008/001025 dated Nov. 24, 2009.

* cited by examiner

| LBN | 0 | 1 | ......... | L | L+1 | ......... | B−m |
|---|---|---|---|---|---|---|---|
| PBN | 3 | 6 |  | A | A |  | B−2 |

| LBN | 0 | 1 | ......... | L | L+1 | ......... | B−m |
|---|---|---|---|---|---|---|---|
| PBN | 3 | 6 |  | B−1 | A |  | B−2 |

| LBN | 0 | 1 | ......... | L | L+1 | ......... | B−m |
|---|---|---|---|---|---|---|---|
| PBN | 3 | 6 |  | B−1 | 1 |  | B−2 |

MEMORY CONTROLLER, SEMICONDUCTOR RECORDING DEVICE, AND METHOD FOR NOTIFYING THE NUMBER OF TIMES OF REWRITING

TECHNICAL FIELD

The present invention relates to a memory controller, a semiconductor recording device, and a method for notifying the number of times of rewriting, the semiconductor recording device including a nonvolatile memory such as a flash memory, and especially relates to a technique for managing the number of times of data recordings.

BACKGROUND ART

A memory card such as an SD (Secure Digital) card (a registered trademark) that is a semiconductor recording card incorporating a flash memory is extremely small and extremely thin, and recently the memory card has been widely used to record data, for example, image data in a digital camera, a mobile phone, and the like owing to ease of handling.

The flash memory incorporated in the semiconductor recording device such as the memory card is a memory able to erase and rewrite data in units of blocks of a predetermined size, and has the limited number of times of the rewritings.

In the flash memory, data cannot be overwritten to a recorded page. In a case of updating data, the flash memory erases all pages of a physical block in a lump by erasing the physical block that is an erasing unit, and writes data in units of the pages. For example, in a case where all pages of a certain physical block have already-written data and only page 0 of the physical block will be updated, the updating is carried out in the following four steps.

(1) Data of all pages of the physical block is read and stored in a volatile memory.
(2) Only page 0 is updated in the volatile memory.
(3) The physical block is erased.
(4) The data in the volatile memory is written to all pages of the physical block.

However, the above-mentioned method has the following problem.

Since data cannot be written in the bad physical block in a case where a physical block turns into a bad physical block, a conversion table between a logical block number and a physical block number is introduced, and when the physical block has turned into a bad physical block, the data is written in a physical block to which different physical block number is added. Accordingly, a method for: preliminarily securing physical blocks of only the estimated number of occurrences of bad blocks extra; when a writing error has occurred, registering a block where the writing error occurred as an error block; and writing data to a physical block other than the error block is employed.

In addition, the flash memory has a life time of the number of times of rewriting; however only the same physical block may be rewritten many times. In the present circumstances, the physical block can be rewritten approximately 100,000 times, and thus a probability of occurrence of the writing error increases in the case where the rewriting is performed more than 100,000 times.

For example, in the case of recording a motion picture in the flash memory in real time, when the writing error frequently occurs, a writing speed to the flash memory becomes lower than a speed at which a generated image is sent to the flash memory. Accordingly, there will be a problem that the motion picture cannot be continuously recorded.

Patent document 1 discloses a conventional technique for ostensibly increasing the number of times of rewriting of the memory to delay the occurrence of this problem. The conventional technique divides the memory into a plurality of regions and stores the number of times of rewriting on each region. The technique controls the rewriting of the memory on the basis of the stored numbers of times of rewriting of each region so that a difference between the respective numbers of times of rewriting of each region can be small, namely, so that a region with the small number of times of rewriting can be preferentially used. Meanwhile, the method for controlling the difference between the respective numbers of times of rewriting of each region to be small is called a leveling. When the conventional technique is applied to the memory card, a physical block in which data is actually written changes in the flash memory even in the case where data is written in the same logical block. When the leveling is perfectly carried out, the possible number of times of rewriting increases up to (Size of memory card/Size of rewritten block)×(The possible number of times of rewriting in each rewritten block).

However, in Patent document 1, the leveling can increase the number of times of rewriting, but the number of times of rewriting cannot be recorded so as to be actually visible and a life time of the memory card cannot be informed to a user.

In Patent document 2, the inventor proposed a memory card comprising: a rewriting number count part for counting the number of times of rewriting that is the number of blocks used when data has been written in a flash memory in response to a command from a host apparatus; a rewriting number reading part for reading the total number of times of rewriting written in the flash memory; a rewriting number writing part for newly obtaining the total number of times of rewriting that is a total count value from the initial rewriting on the basis of the number of times of rewriting counted by the rewriting number count part and the total number of times of rewriting read by the rewriting number reading part and for writing the obtained total number of times of rewriting in the flash memory. The rewriting number writing part is characterized by writing the obtained total number of times of rewriting in the flash memory at a time when the number of times of rewriting after the previous writing of the total number of times of rewriting has reached a predetermined number of times or more.

In a camera recorder and the like for recording image data, when data of total capacity of the memory card has been recorded, the data is transferred to an HDD and the like and then the memory card is formatted to be used again for the recording. In such usage, (Physical block size)×(The number of times of rewriting/Size) is nearly same as an upper limitation value of the number of times of rewriting of the semiconductor memory.

Patent document 1: Japanese Unexamined Patent Publication No. H06-302194
Patent document 2: Japanese Unexamined Patent Publication No. 2005-284659

DISCLOSURE OF THE INVENTION

Problems to be Solved by the Invention

As described above, in the conventional semiconductor recording device, the method for ostensibly increasing the number of times of rewriting of the memory by using the leveling and the method for knowing a life time of the semiconductor recording device by writing the number of times of rewriting in the flash memory are established.

However, measures for the following two problems are not enough.

(Problem 1) Deterioration of a data retention property of a block associated with the increment of the number of times of rewriting.

(Problem 2) Accumulation of errors of the number of times of rewriting associated with a shutoff of electric power in a memory card and the like.

The above-mentioned problems will be explained below.

At first, the retention property of Problem 1 will be explained. Expansion of a capacity of the flash memory is in progress. The expansion of the capacity is mainly realized by a multi-level NAND flash memory. In a single-level NAND flash memory, an initial data retention time is 10 years and the data retention time after the hundred thousand rewritings is 1 year. Meanwhile, in the multi-level NAND flash memory of a currently main technical trend, an initial data retention time is 10 years and the data retention time after the ten thousand rewritings is 1 year. In addition, in the multi-level NAND flash memory, since the recording is realized by dividing an amount of electric charge accumulated in a gate oxide film into multi-levels, for example, 4 levels, it is expected that the data retention time becomes further short with refinement of the process. Regarding data recorded by a user, when the data is, for example, transferred to an HDD immediately after recording a camera recorder even in the case where the data retention time has become further short, no practical problem occur. However, information of the number of rewritings is specific to a memory card and cannot be transferred to other device. Accordingly, it is required to improve reliability of the data retention related to the number of rewritings.

Next, a problem related to the shutoff of electric power of Problem 2 will be explained. In the memory card of Patent document 2, in order to reduce influence of the number of times of rewritings given to increase of the total number of rewritings, the total number of rewritings is not updated in each rewriting and the total number of rewritings is written to the flash memory at a time when the number of times of rewritings after previous rewriting of the total number of times of rewritings has reached the predetermined number of times. However, in a case where the shutoff of electric power has occurred before the number of times of rewritings from the previous rewriting of the total number of times of rewritings reaches the predetermined number or the memory card is unexpectedly pulled put, the increase of the number of times of rewritings is not reflected to the recording. Accordingly, a problem that increases an error of the total number of times of rewritings will occur. In addition, since an upper limit value of the number of times of rewritings is small in the multi-level NAND flash memory, the counting error of the number of times of rewritings generated by the registration failure of the number of times of rewritings caused by the shutoff of electric power and the like cannot be ignored.

The present invention is to solve the above-mentioned problem, and provides a memory controller, a semiconductor recording device, and a method for notifying the number of times of rewritings that are able to improve a retention property of the number of times of rewritings and realize prevention of the registration failure of the number of times of rewritings caused by the shutoff of electric power in a case of outputting the number of times of rewritings of a semiconductor recording device and to substantially improve the reliability and accuracy of the number of times of rewritings.

Means to Solve the Problems

To solve the problem, a semiconductor recording device of the present invention comprises: at least one nonvolatile memory composed of a plurality of physical blocks; and a memory controller for writing data in said nonvolatile memory and reading the data from said nonvolatile memory, wherein said nonvolatile memory is divided into a first region and a second region in units of physical blocks, said first region records: a first information table for creating a correspondence relationship between a logical address issued by a host apparatus and a physical address in units of the physical blocks; and user data transferred from the host apparatus, and said second region records a second information table composed of: a physical address of a physical block storing said first information table; and the number of times of update of the physical block storing said first information table from the time of manufacturing, and wherein said memory controller includes: an empty block management table for managing the physical block in the first region of said nonvolatile memory; a first management part for upon receiving a writing command issued from the host apparatus, referring to said empty block management table and allocating a physical block to record the user data in said first region and for referring to said empty block management table and newly allocating the physical block, in a case of newly allocating a physical block to store said first information table; a first information table update part for updating said first information table, in a case of newly allocation a physical block to record the user data transferred from the host apparatus; a second information table update part for updating said second information table, in a case where said first management part newly allocated a physical block to record said first information table; a second management part for managing a physical block storing said second information table and recording data in the physical block in the second region of said nonvolatile memory in a rotational manner; and a rewriting number conversion part for converting the number of times of update of the physical block storing said first information table from the time of manufacturing, the number being stored in said second information table, into the total number of times of rewriting of the first region of the nonvolatile memory, the memory controller notifying the total number of times of rewriting of the first region of said nonvolatile memory as the number of times of rewriting to the host apparatus.

The physical block of said nonvolatile memory may be composed of N (N is a natural number) pages, said first information table may be recorded in a physical block for the first information table allocated to the first region of said nonvolatile memory, and said first information table may be updated in units of pages every time a physical block to record the user data transferred from the host apparatus is allocated.

The number of physical blocks to be allocated to the second region of said nonvolatile memory may be determined depending on reliability of the number of times of rewriting of an incorporated nonvolatile memory.

To solve the problem, a memory controller of the present invention which writes data in a nonvolatile memory having a first and a second regions in units of the physical blocks and reads the data from said nonvolatile memory, the memory controller being composed of a plurality of physical blocks, comprises: an empty block management table for managing the physical block in said first region of said nonvolatile memory; a first management part for upon receiving a writing command issued from the host apparatus, referring to said empty block management table and allocating a physical block to record the user data in said first region and for referring to said empty block management table and newly allocating the physical block, in a case of newly allocating a physical block storing a first information table that creates a correspondence relationship between a logical address issued by a host apparatus and a physical address in units of the physical blocks; a first information table update part for updating said first information table, in a case of newly allocation a physical block to record the user data transferred from the host apparatus; a second information table update part for updating said second information table composed of: a physical address of a physical block storing said first information table; and the number of times of update of the physical block storing said first information table from the time of manufacturing, in a case where said first management part newly allocated a physical block to record said first information table; a second management part for managing a physical block storing said second information table and recording data in the physical block in the second region of said nonvolatile memory in a rotational manner; and a rewriting number conversion part for converting the number of times of update of the physical block storing said first information table from the time of manufacturing, the number being stored in said second information table, into the total number of times of rewriting of the first region of the nonvolatile memory, the memory controller notifying the total number of times of rewriting of the first region of said nonvolatile memory as the number of times of rewriting to the host apparatus.

The physical block of said nonvolatile memory may be composed of N (N is a natural number) pages, said first information table may be recorded in the physical block for the first information table allocated to the first region of said nonvolatile memory, and said first information table may be updated in units of pages every time a physical block to record the user data transferred from the host apparatus is allocated.

The number of physical blocks to be allocated to the second region of said nonvolatile memory may be determined depending on reliability of the number of times of rewriting of an incorporated nonvolatile memory.

To solve the problem, a method for notifying the number of times of rewriting of the present invention comprises steps of: evenly recording: a first information table creating a correspondence relationship between a logical address issued by a host apparatus and a physical address in units of the physical blocks; and user data transferred from the host apparatus in a first region of a nonvolatile memory; evenly recording a second information table composed of: a physical address of a physical block storing said first information table; and the number of times of update of the physical block storing said first information table from the time of manufacturing in a second region of said nonvolatile memory; when the number of times of rewriting is requested from an outside device, converting the number of times of update of the physical block storing said first information table from the time of manufacturing, the number being stored in said second information table, into the total number of times of rewriting of the first region of the nonvolatile memory; and notifying the total number of times of rewriting of the first region of said nonvolatile memory as the number of times of rewriting.

The physical block of said nonvolatile memory may be composed of N (N is a natural number) pages, said first information table may be recorded in the physical block for the first information table allocated to the first region of said nonvolatile memory, and said first information table may be updated in units of pages every time a physical block to record the user data transferred from the host apparatus is allocated.

The number of physical blocks to be allocated to the second region of said nonvolatile memory may be determined depending on reliability of the number of times of rewriting of an incorporated nonvolatile memory.

Effectiveness of the Invention

According to a memory controller, a semiconductor recording device, and a method for notifying the number of times of rewritings, by independently recording data to a physical block in a first memory region and to a physical block in a second memory region to average the recording, the number of times of rewritings of a second region of a flash memory can be suppressed and reliability of the number of times of update of said first information table from the time of manufacturing, the number being recorded in the second region of the memory, can be improved.

In addition, when the number of times of rewritings is recorded in a nonvolatile memory every time the first information table is updated, a value of the total number of times of rewritings increases by 1. Accordingly, since an error of the number of times of rewritings generated by a single shutoff of electric power is at most only 1, accumulation of the error of the number of times of rewritings generated by the shutoff of electric power can be suppressed.

Thus, a system with high reliability able to easily detect the number of times of rewritings by: calculating the number of times of rewritings of the nonvolatile memory on the basis of the number of times of update of said first information table from the time of manufacturing, the number being recorded in the second region of the nonvolatile memory; and notifying a host apparatus of the number.

EXPLANATION FOR REFERENCE NUMERALS

11 Semiconductor recording device
12 Host apparatus

20 Flash memory
30 Memory controller
31 External interface
32 Command analysis part
33 First management part
34 Empty block management table
35 First information table
36 First information table update part
37 Second management part
38 Second information table
39 Second information table update part
40 Flash control part
41 Rewriting number conversion part

BEST MODE FOR CARRYING OUT THE INVENTION

Figure 1:
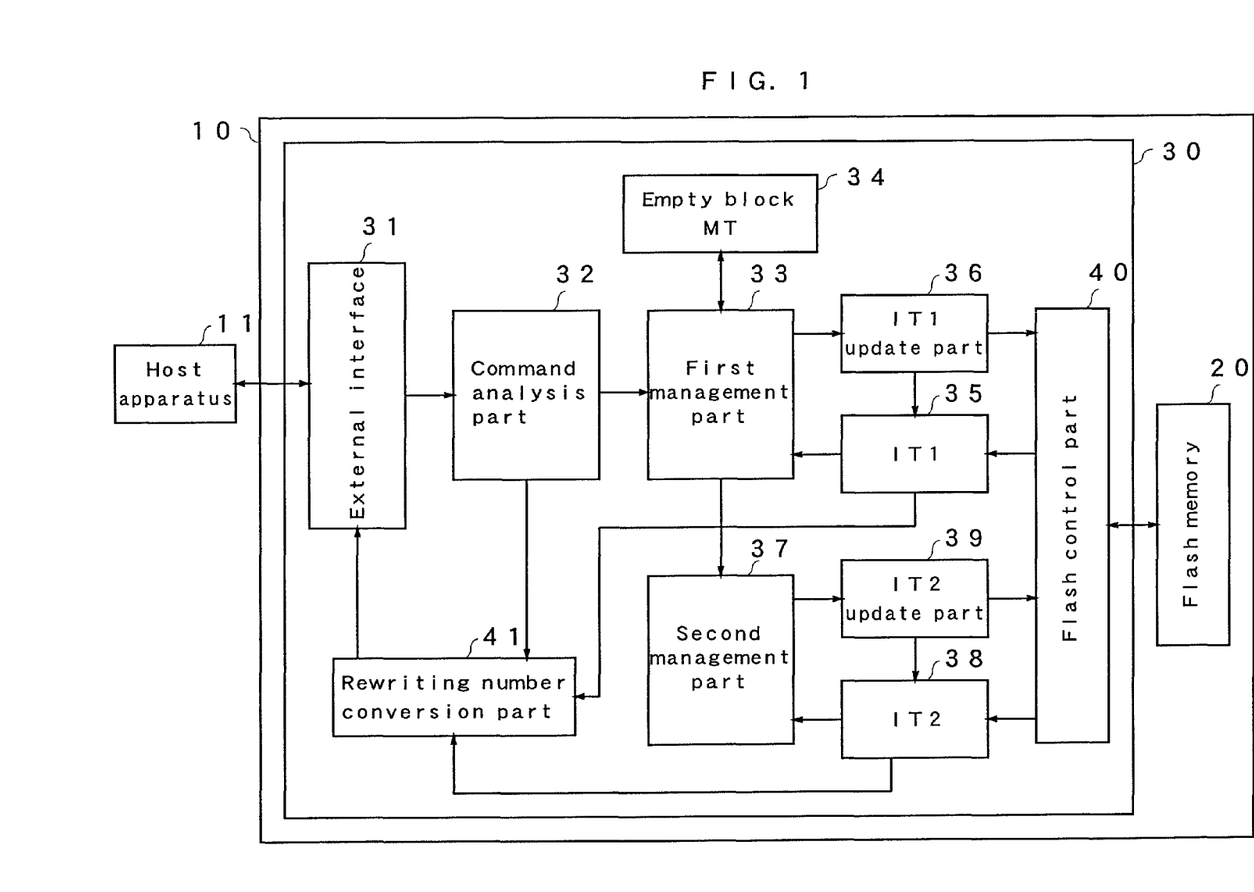
FIG. 1 is a configuration view of a memory card according to embodiment 1 of the present invention.

FIG. 1 shows a configuration view of a semiconductor recording device according to an embodiment of the present invention. In FIG. 1, a semiconductor recording device 11 is realized as, for example, a memory card, and is used by connecting to a host apparatus 12. The semiconductor recording device 11 is configured by including: a flash memory 20 that is a nonvolatile memory; and a memory controller 30 for controlling the data writing and reading to the flash memory 20.

Next, the memory controller 30 will be explained in detail. An external interface 31 receives a command from the host apparatus 11 and transfers data. A command analysis part 32 analyzes a command received by the external interface 31. In addition to this, when a rewriting number read command of the flash memory is given from a host command specific to the present invention in addition to a reading command and a writing command, the command analysis part 32 recognizes a command as this command. Additionally, in the memory controller 30, blocks for writing and reading data in and from the flash memory 20 in accordance with the command analysis is needed; however, these are the same as conventional blocks, and accordingly their descriptions are omitted in FIG. 1 and only a characteristic part of the present invention is described.

Then, the first management part 33 manages an empty block management table (an MT in the drawing) 34 and a first information table (an IT1 in the drawing) 35. The empty block management table 34 is for managing whether physical blocks of the flash memory 20 is already used or empty, and is composed of a volatile memory.

The first information table 35 is a logical-physical conversion table showing a correspondence between a logical block number issued from the host and a physical block number at which data is written in the flash memory 20. The table is recorded in the volatile memory of the memory controller 30, and is simultaneously recorded in 1 page of any one of the physical blocks of the flash memory 20. A first information table update part 36 updates the first information table 35 and updates records of the first information table in the flash memory 20 in a case where a writing command is issued from the host apparatus 11 and a new physical block is allocated to a logical block.

A second management part 37 manages a second information table (an IT2 in the drawing) 38. The second information table 38 is a table that records information of the physical block recording the first information table, and is composed of a volatile memory. The second information table 38 records the following information;

(A) A physical block number at which the first information table is recorded, and (B) The number of times of update of the physical block storing the first information table from the time of manufacturing.

The table is recorded in the volatile memory of the memory controller 30, and is simultaneously recorded in 1 page of any one of the physical blocks of the flash memory 20. In addition, a second information table update part 39 updates the second information table and updates records of the second information table in the flash memory 20 in a case where a position of the physical block at which the first information table is recorded is updated.

Next, a flash control part 40 writes data in the flash memory 20 and reads data from the flash memory 20 on the basis of a writing command or read command and commands from the first and second information table update parts 36 and 39.

When the rewriting number read command has given from the host apparatus 11, a writing number conversion part 41 calculates the number of times of rewritings on the basis of information of the first and second information tables 35 and 38, and outputs the result from the external interface 31.

Figure 2:
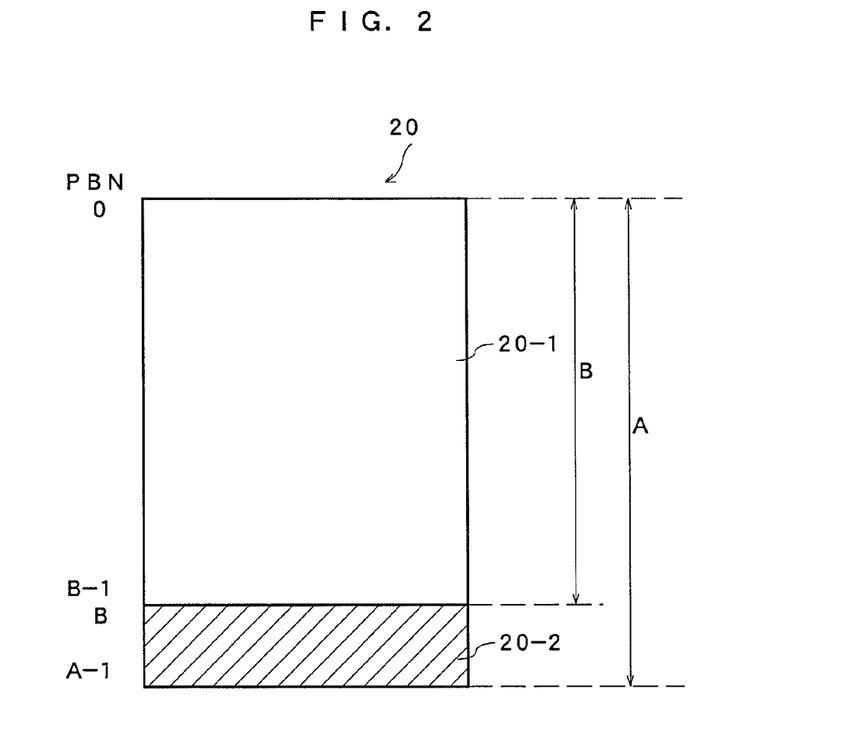
FIG. 2 is an explanation view of a memory region in a flash memory according to the embodiment.
Figure 3:
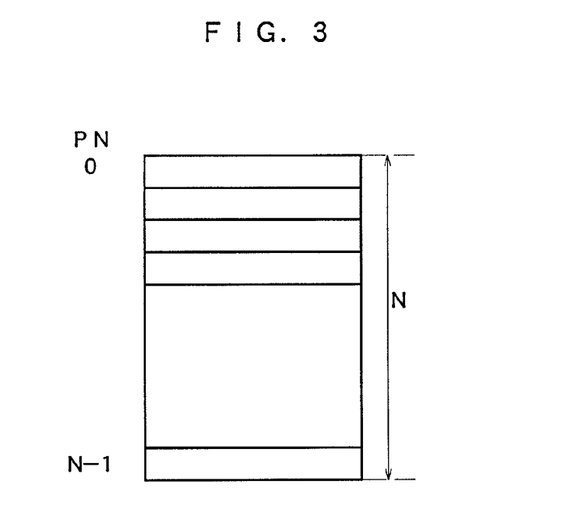
FIG. 3 is a configuration view of a physical block constituting the flash memory.

Next, the flash memory 0 will be explained. FIG. 2 is a region map of the flash memory 20, and FIG. 3 shows a configuration view of one physical block of the memory.

The flash memory 20 is composed of A physical blocks (A is a natural number), and physical block numbers (PBN) from 0 to (A−1) are added to the A physical blocks in the embodiment. Among them, a group of physical block numbers 0 to (B−1) (B is a natural number satisfying B<A), B physical blocks, is set as a first region 20-1 of the flash memory 20 and a group of physical block numbers B to (A−1), (A−B) physical blocks, is set as a second region 20-2 of the flash memory 20. Each of the physical blocks is composed of N pages (N is a natural number) shown in FIG. 3, and page numbers (PN) from 0 to (N−1) are added to the respective pages.

Next, in the embodiment, (B−m+1) logical blocks (m is a natural number) of logical block numbers (LBN) from 0 to (B−m) for recording user data are mapped to the physical blocks of the first region 20-1 of the flash memory 20 shown in FIG. 2, and the user data is recorded. Now, assuming m=9, the first region 20-1 is composed of B physical blocks, (B−8) physical blocks of these physical blocks are used for recording the user data. The remaining 8 physical blocks are used as a physical block for retaining the first information table or as a spare block. That is, the B physical blocks of the first region 20-1 are classified into three types;

(Type 0): a physical block for recording user data related to a logical block, (Type 1): a physical block for recording the first information table, and (Type 2): a spare physical block used when a late-occurring bad block has occurred.

Figure 4:
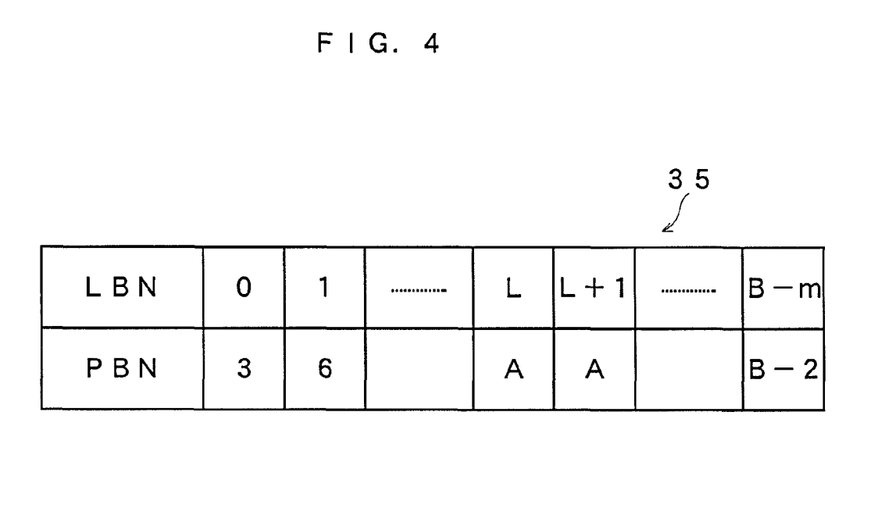
FIG. 4 is an explanation view of a first information table of the present invention.

And next, the first information table 35 will be explained. The first information table 35 is a conversion table between the logical block number and the physical block number, and FIG. 4 shows one example of the table. FIG. 4 shows that a logical block of logical block number 0 is mapped to a physical block of physical block number 3 and a logical block of logical block number 1 is mapped to a physical block of physical block number 6. In addition, regarding logical block numbers L and (L+1), columns of corresponding physical blocks represent "A", and the "A" indicates that the physical block is an empty block that does not store data. In this manner, the logical block is related to the physical block by using the first information table 35, and when a late-occurring bad block has occurred, occurrence of a bad block is handled by not using the physical block.

Moreover, in the embodiment, the leveling is carried out separately to the first region and the second region. In the leveling to the first region, use frequencies of physical blocks of type 0 and type 1 are averaged. The method controls unused physical blocks to be evenly used by using the empty block management table 34 showing use states of the respective physical blocks. For this purpose, the unused physical blocks may be used in a rotational manner in the first region, or a physical block in which data will be written may be randomly selected from among the unused physical blocks. The following explanation will be made assuming the unused physical blocks are used in a rotational manner.

Figure 5:
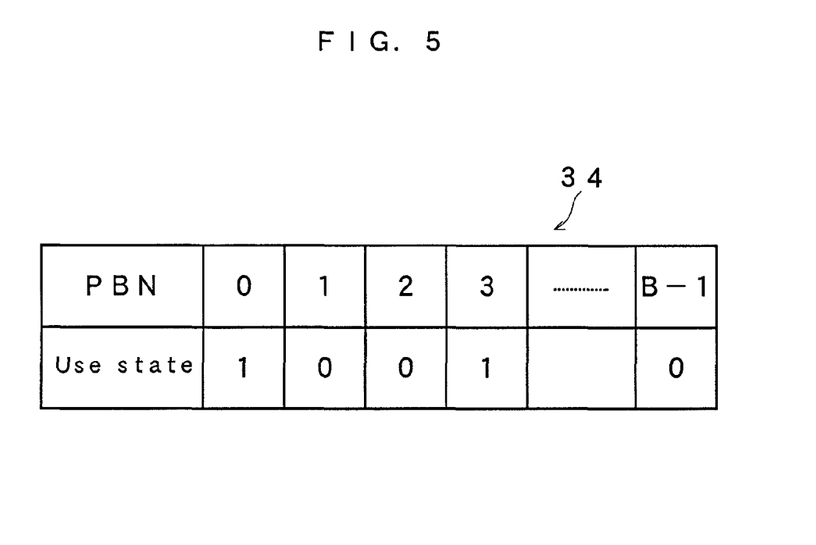
FIG. 5 is an explanation view of an empty block management table of the present invention.

Next, the empty block management table 34 will be explained. FIG. 5 is a view showing one example of the empty block management table 34, and shows the use states of the respective physical blocks. It is shown that A physical block whose use state is 1 is in use, and a physical block whose use state is 0 is empty and can be newly used. The flash memory 20 does not retain the same contents as the empty block management table 34, and the empty block management table 34 is created in each power supply in the following steps;

(1) When an electric power is supplied, all blocks are initialized to be in an empty state, (2) The bad block is updated to be in a used state (Since the management of the bad block is not essence of the present invention, the detailed description is omitted, and number(s) of the bad block(s) is/are recorded to a fixed position of the flash memory), (3) The first information table 35 is read, and a used physical block is updated to be in a used state in the empty block management table 34, and (4) At the time when the first information table 35 is updated, the update is reflected in the table 34.

As described above, in the case where the empty block management table 34 is created at the power supply and subsequently data is written to an empty physical block, an empty block searched in sequence from the empty block management table 34 is allocated as a new block and the empty block management table 34 is updated.

Figure 6A:
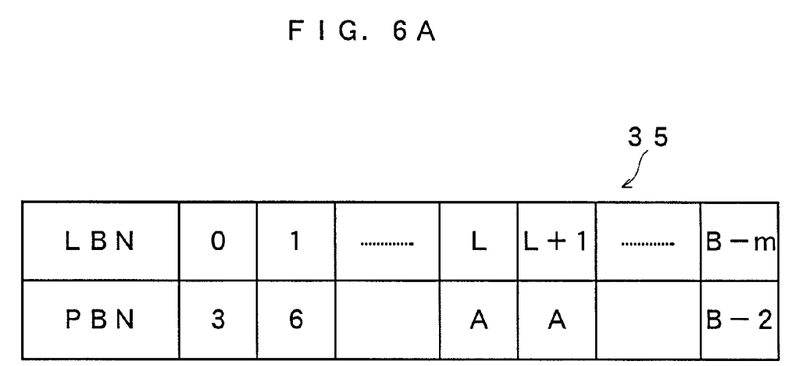
FIG. 6A is a transition view of a first information table of the present invention.
Figure 6B:
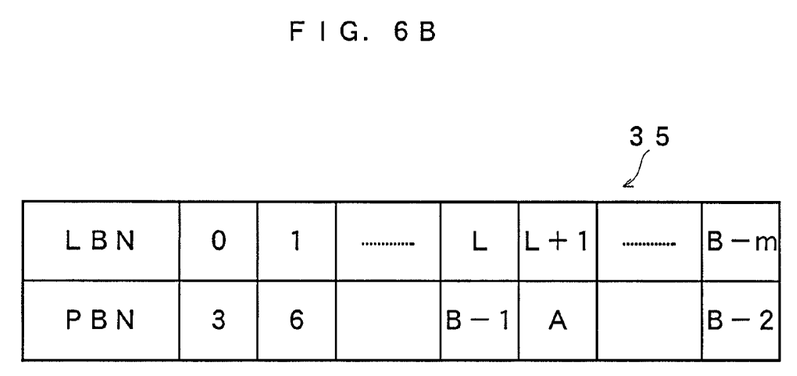
FIG. 6B is a transition view of the first information table of the present invention.
Figure 6C:
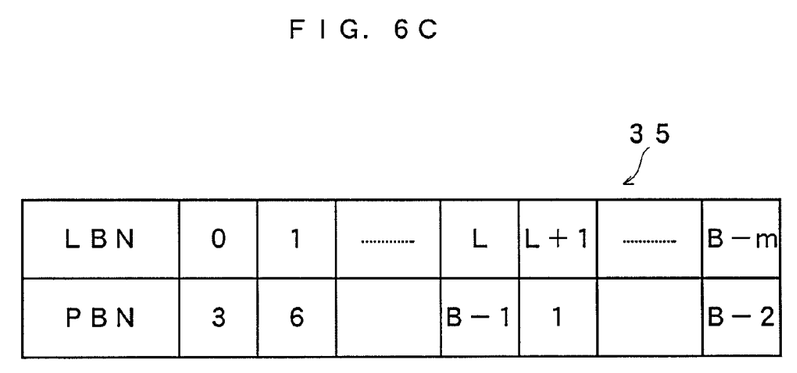
FIG. 6C is a transition view of the first information table of the present invention.
Figure 7A:
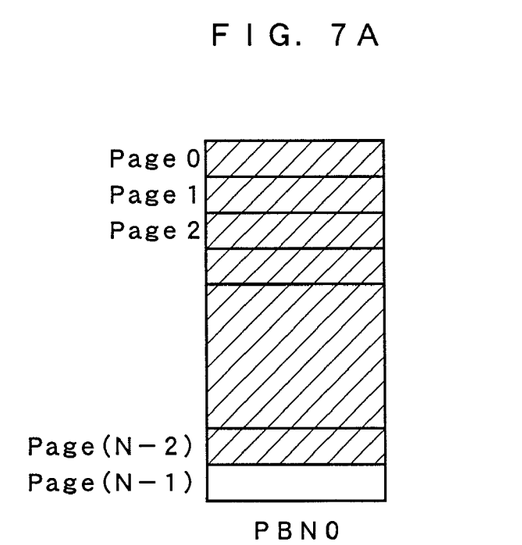
FIG. 7A is a transition view of a physical block storing the first information table of the present invention.
Figure 7B:
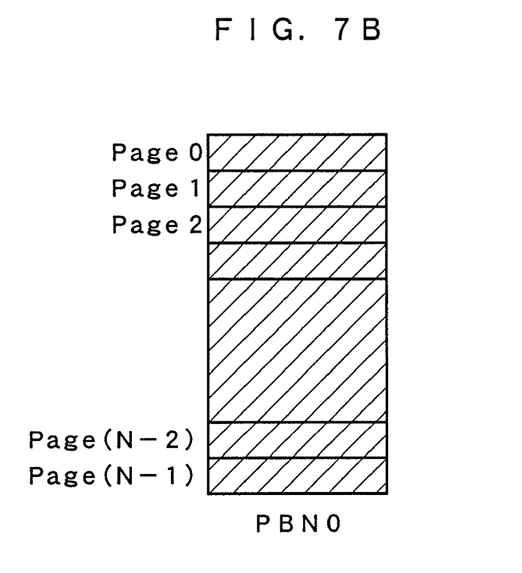
FIG. 7B is a transition view of the physical block storing the first information table of the present invention.
Figure 7C:
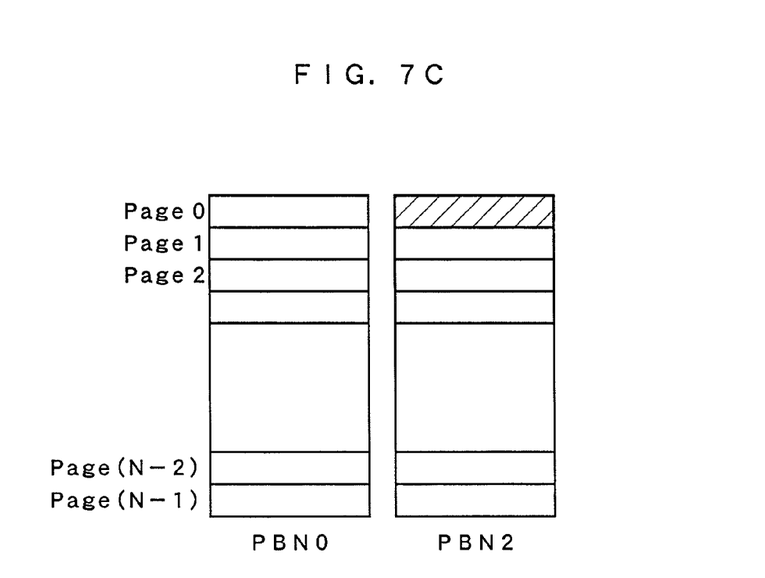
FIG. 7C is a transition view of physical blocks storing the first information table of the present invention.

And next, a recording operation to the physical block of type 1 storing the first information table 35 will be explained. FIG. 6A to FIG. 6C are views showing transition of the first information table 35, and FIG. 6A shows a state of the first information table at a point of time. FIG. 7A to FIG. 7C are views showing transition of states of the physical block storing the first information table 35, and a shaded portion indicates a used page. In FIG. 7A, physical block number PBN0 stores the first information table 35. In this physical block, data is already recorded in page 0 to page (N−2) at the point when the first information table 35 is in the state of FIG. 6A and data is not recorded in page (N−1) yet. In the embodiment, since the first information table 35 is recorded in sequence in units of pages from the first page of the physical block, the (N−1) first information tables are already recorded in the physical block in the state of FIG. 7A, which shows the latest first information table 35 shown in FIG. 6A is retained in the page (N−2).

Referring to FIG. 5, FIG. 6, and FIG. 7, an operation of a case where a writing command has been issued from the host apparatus 11 to an Lth logical block in the states shown in FIG. 6A and FIG. 7A will be explained.

As shown in FIG. 6A, in the current first information table 35, a physical block related to the logical block number L is in the state of "A" indicating invalidity, and a physical block is not allocated to the logical block number. Accordingly, referring to the empty block management table 34, the first management part 33 searches an empty block. The current empty block management table 34 is in the state shown in FIG. 5, and it is assumed that the (B−1)th physical block has been searched. Accordingly, the first management part 33 allocates a physical block of a physical block number (B−1) to the logical block of the logical block number L. In addition, the first information table update part 36 updates the first information table 35 in the manner shown in FIG. 6B, and writes the updated first information table 35 in the flash memory 20 via the flash control part 40. The state of the physical block of PBN0 allocated to the current first information table transits from the state of FIG. 7A to that of FIG. 7B by writing the updated first information table in the page (N−1).

Moreover, a case where a writing command was issued to a (L+1)th logical block will be explained. As shown in FIG. 6B, in the first information table at this point of time, a physical block related to the (L+1)th logical block is in the state of "A" indicating invalidity, and a physical block is not allocated to the logical block number. Accordingly, the first management part 33 searches an empty block, and it is assumed that a physical block of physical block number 1 has been searched. The first management part 33 allocates the physical block number 1 to a logical block of the logical block number (L+1). The first information table update part 36 updates the first information table 35 in the manner shown in FIG. 6C, and writes the updated first information table 35 in the flash memory 20 via the flash control part 40. In the physical block of the physical block number 0 allocated to the current first information table, data is already recorded in all pages as shown in FIG. 7B. In this case, the first management part 33 searches an empty block. It is assumed that a physical block of physical block number 2 is searched in this search. And, the latest first information table shown in FIG. 6C is written in page 0 of the physical block of physical block number 2. Then, the empty block management table 34 is updated so as to set the physical block of physical block number 0 to be an unused block and set the physical block of physical block number 2 to be a used block. FIG. 7C shows this state.

Figure 8:
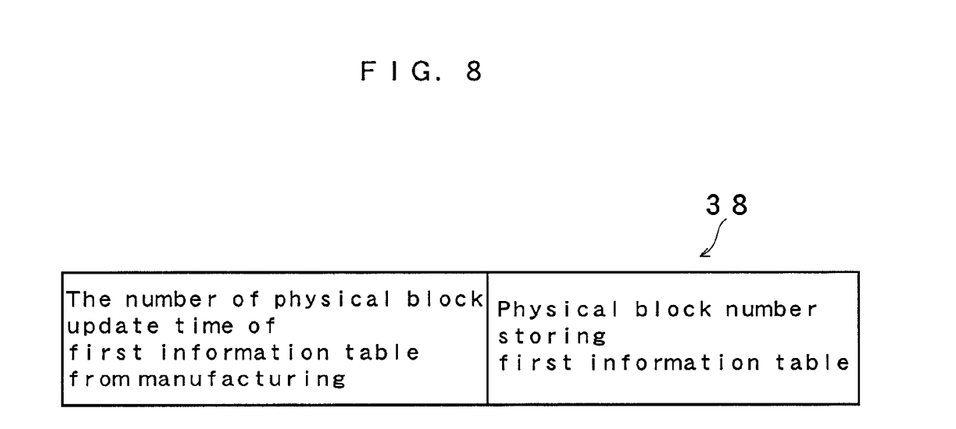
FIG. 8 is an explanation view of a second information table of the present invention.
Figure 9A:
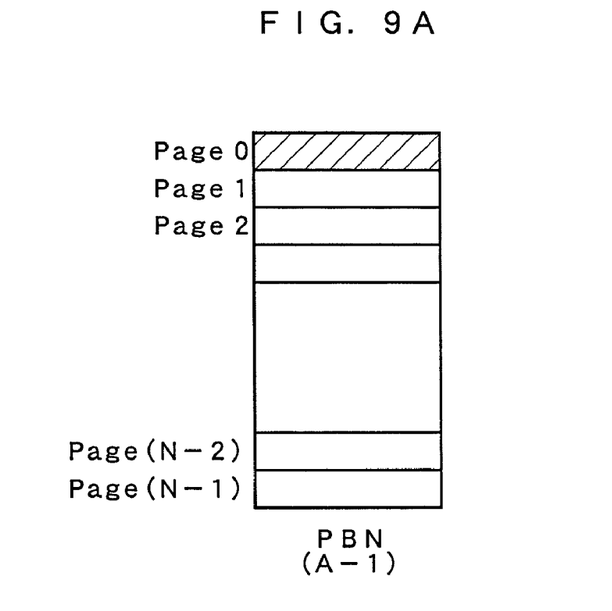
FIG. 9A is a transition view of a physical block storing the second information table of the present invention.
Figure 9B:
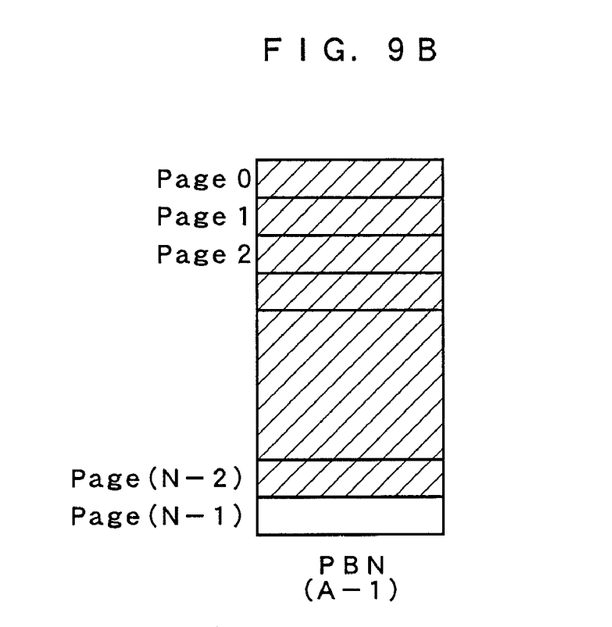
FIG. 9B is a transition view of the physical block storing the second information table of the present invention.
Figure 9C:
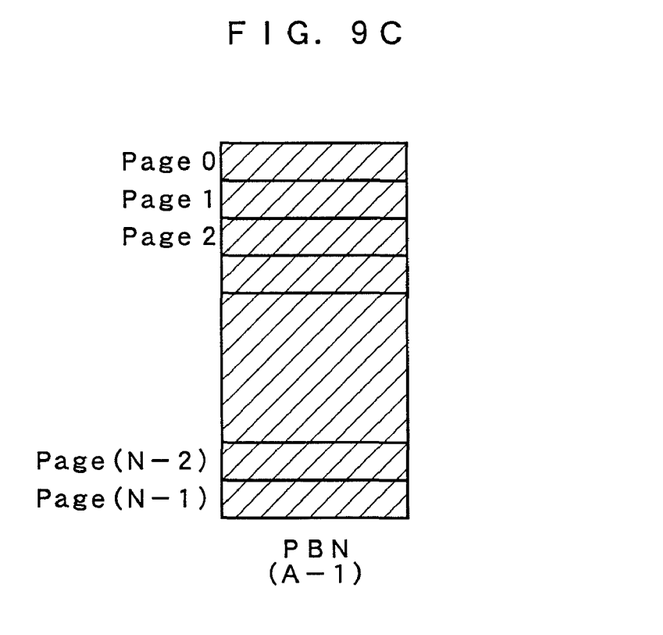
FIG. 9C is a transition view of the physical block storing the second information table of the present invention.

Next, the management of the first information table 35 will be explained. The first information table 35 is managed on the basis of the second information table 38. FIG. 8 shows one example of the second information table 38. FIG. 9A to FIG. 9D are explanation views of states of transition of the physical block recording the second information table 38 in the flash memory 20. The second information table is recorded in a rotational manner in the second region 20-2 of the flash memory 20 shown in FIG. 2. For example, a physical block of physical block number (A−1) is allocated as a physical block for recording the second information table at the time of manufacturing, and an initial value of the second information table 38 is written in page 0 as shown in FIG. 9A. Then, when another physical block replaces a physical block of type 1 that stores the first information table, the second information table update part 39 updates the second information table 38 and records the updated second information table 38 in page 1 of the physical block of physical block number (A−1). After this, this process is carried out in every replacement of the physical block of type 1. FIG. 9B shows a state of the physical block of physical block number (A−1) at the time when the physical block number of the first information table has been updated (N−1) number of times. The number of times of updating of the physical block storing the first information table from the time of manufacturing is (N−1) in this case. FIG. 9C shows a state of physical block PBN (A−1) storing the second information table at the time when the physical block number of the first information table has been updated N number of times. The number of times of updating of the physical block storing the first information table from the time of manufacturing is N in this case.

Figure 9D:
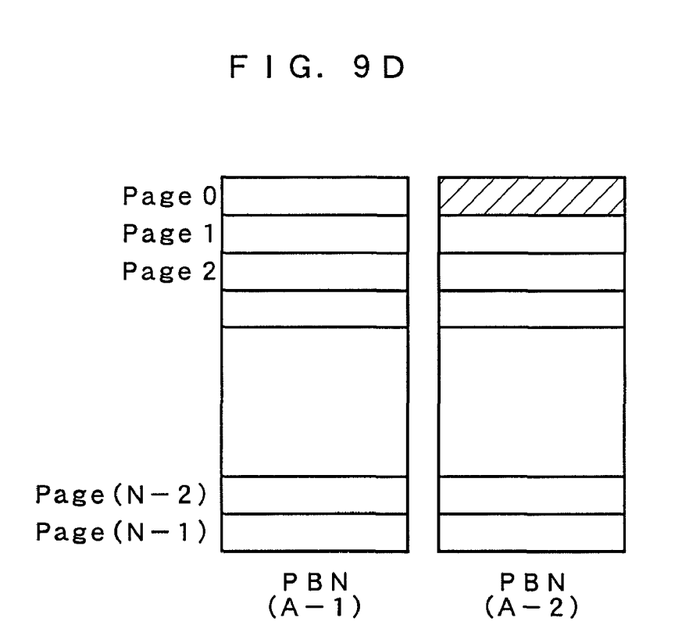
FIG. 9D is a transition view of physical blocks storing the second information table of the present invention.

Meanwhile, when the physical block number of the first information table 35 has been updated (N+1) number of times, data is already written in all pages of the physical block of physical block number (A−1), and accordingly the second information table 38 is recorded in a physical block of physical block number PBN (A−2). FIG. 9D shows a state of the physical blocks of PBN (A−1) and PBN (A−2) at this point of time. The number of times of updating of the physical block storing the first information table from the time of manufacturing is (N+1) in this case.

As described above, in the second region 20-2 of the flash memory, data is recorded in the second region 20-2 in a rotational manner in the order, for example, the physical block of PBN (A−1), the physical block of PBN (A−2), ..., Bth physical block of a first block of the second region 20-2, and the physical block of PBN (A−1).

The second management part 37 reads the latest second information table recorded in the second region 20-2 of the flash memory via the flash control part 40 at the power supply to the system, and refers to the number of times of the updates of the physical block of type 1 from the time of manufacturing to determine the current second information table 38. Then, every time the physical block storing the first information table is updated, the second information table update part 39 updates the information table 38 and records the table in the flash memory 20 via the flash control part 40.

Next, an operation of the rewriting number conversion part 41 will be explained. The number of times of rewritings can be converted from data of the first and second information tables 35 and 38.

The first information table 35 is a conversion table between a logical block and a physical block, and when the first information table is updated every time one block is converted, the following expression (1) is satisfied, the number of times of update of the first information table=the total number of times of rewritings of the physical block of the first region   (1).

Moreover, the first information table is updated in units of pages, and accordingly when the number of times of update of the physical block of type 1 from the time of manufacturing is UPDATE#BLK#NUM, the number of pages constituting the physical block is N, and a page number of the physical block in which the current first information table exists is X, the number of times of update of the first information table from the time of manufacturing is shown by the following expression (2):

the number of times of update of the first information table from the time of manufacturing= (UPDATE#BLK#NUM)*N+X   (2).

In addition, the number of times of rewritings of the physical block of the first information table is shown by the following expression (3):

the number of times of rewritings of the physical block of the first information table=UPDATE#BLK#NUM   (3).

Accordingly, on the basis of the expression (1), expression (2), and expression (3), the total number of rewritings of the physical block of the first region is obtained by the following expression (4):

the total number of rewritings of the physical block of the first region=(UPDATE#BLK#NUM)*(N+1)+X   (4).

As described above, referring to the recorded page number X of the first information table and the number of updates UPDATE#BLK#NUM retained in the second information table, the total number of rewritings of the physical block of the first region of the memory is obtained by the expression (4).

Then, since the number of physical blocks of the first region 20-1 of the flash memory 20 is B, the number of times of rewriting of the whole first region is shown by the following expression (5):

the number of times of rewritings of the first region= (the total number of times of rewriting of physical block of the first region)/(the number of physical blocks of the first region)= ((UPDATE#BLK#NUM)*(N+1)+X)/B   (5).

When the rewriting number reading command for the flash memory is issued from the host apparatus, the command is given to the rewriting number conversion part 41 by the command analysis part 32. The rewriting number conversion part 41 derives the number of times of rewriting of the flash memory by using the expression (5), and transfers the number to the host apparatus 11 via the external interface 31. In this manner, a highly-reliable system able to easily detect the number of times of rewriting can be constituted.

Next, the number of times of rewriting of the second region of the flash memory will be explained. The total number of times of rewriting of the physical block of the second region of the memory is shown by the following expression (6). Meanwhile, Int[Y] is the maximum integer number not exceeding Y.

The total number of times of rewriting of the physical block of the second region=Int[the number of times of rewriting of the physical block of the first information table/N]+1   (6).

Accordingly, based on the expression (3), the total number of times of rewriting of the physical block of the second region of the memory is shown by the following expression (7). In addition, since the number of physical blocks of the second region of the memory is (A−B), the number of times of rewriting of whole second region of the memory is shown by the following expression (8):

the number of times of rewriting of the second region=(Int[UPDATE#BLK#NUM/N]+1)/(A−B)   (8).

Here, the number of recording pages per physical block of the flash memory is approximately 100, the number of times of rewriting is approximately 10,000, the number of physical blocks of the flash memory is approximately 10,000, and influence of the X is small, and accordingly when the number of times of rewriting of the first region of the memory=10,000, B=10,000, N=100, and X=0 are substituted into the expression (5) and the UPDATE#BLK#NUM is obtained, the UPDATE#BLK#NUM becomes approximately equal to $1.0 \times 10^6$.

The number of times of rewriting of the second region of the flash memory of a case where 10 physical blocks are allocated to the second region is approximately $1.0 \times 10^3$. That is, the number of rewriting of the second region becomes overwhelmingly small in comparison with the number of times of rewriting of the first region of the memory. In the above-mentioned example, the number of times of rewriting of the second region of the memory becomes one-tenth of that of the first region of the memory, and can be substantially suppressed. Accordingly, when data is recorded independently in the physical block of the first region and in the physical block of the second region in a rotational manner, the number of times of rewriting of the second region of the flash memory can be suppressed and reliability of the number of times of update of said first information table from the time of manufacturing, the number being recorded in the second region, can be improved. In this manner, deterioration of the retention property of the rewriting number registration block caused by increase of the number of times of rewriting, the deterioration is the first problem, can be suppressed.

Next, the second problem "Accumulation of errors of the number of times of rewriting associated with a shutoff of electric power in a memory card and the like" to be solved by the present invention will be explained. In the embodiment, since the writing to the first information table is equivalent to one of the total number of times of rewriting, the counting error of the total number of times of rewritings caused by the shutoff of electric power is classified into the following two cases:

(1) the shutoff of electric power immediately before the writing of the first information table, where the error is one, and (2) the shutoff of electric power in the writing of the first information table, where the error is also one because a physical block of an updated portion related to the information table to be updated is not registered.

Meanwhile, since being related to the number of times of rewriting of the second region, the shutoff of electric power immediately before the writing of the second information table or the shutoff of electric power in the writing does not affect the error. Thus, according to the embodiment, the accumulation of errors of the number of times of rewriting associated with the shutoff of electric power can be minimized.

Additionally, in the embodiment, the reliability of the second region of the memory is improved by setting the number of times of rewriting of the second region of the memory to be approximately 1,000. The number of physical blocks of the second region is generally in inverse proportion to the number of times of rewriting of the region, and accordingly when the physical blocks allocated to the second region is increased, the more highly-reliable system can be constituted. That is, as the high reliability is required for data of the number of times of rewriting of an incorporated flash memory more, the number of physical blocks allocated to the second region may be set to be large.

Moreover, in the embodiment, the recording position X of the first information table and the number of times of rewriting recorded in the second information table are calculated; however, the number of times of rewriting may be calculated only from the number of times of update of said first information table from the time of manufacturing because the influence of the X is small and may be notified to the host apparatus.

Meanwhile, in the embodiment, data is recorded in the rotational manner in both of the first and second regions of the flash memory; however, since it is required to evenly use the physical blocks of the respective regions, the recording may be carried out not only in the rotational manner but by randomly selecting an empty block in each region.

INDUSTRIAL APPLICABILITY

Since the host apparatus can detect the number of times of rewriting and can know time to replace the memory card and the memory card drive, the memory controller and semiconductor recording device of the present invention have a great possibility of being used in a professional video picture field where a large size of data is recorded.

The invention claimed is:

1. A semiconductor recording device comprising:
at least one nonvolatile memory composed of a plurality of physical blocks; and
a memory controller for writing data in said nonvolatile memory and reading the data from said nonvolatile memory, wherein
said nonvolatile memory is divided into a first region and a second region in units of physical blocks,
said first region records: a first information table for creating a correspondence relationship between a logical address issued by a host apparatus and a physical address in units of the physical blocks; and user data transferred from the host apparatus, and
said second region records a second information table composed of: a physical address of a physical block storing said first information table; and a number of times of update of the physical block storing said first information table from the time of manufacturing, and wherein
said memory controller includes:
an empty block management table for managing the physical block in the first region of said nonvolatile memory;
a first management part for upon receiving a writing command issued from the host apparatus, referring to said empty block management table and allocating a physical block to record the user data in said first region and for referring to said empty block management table and newly allocating the physical block, in a case of newly allocating a physical block to store said first information table;
a first information table update part for updating said first information table, in a case of newly allocation a physical block to record the user data transferred from the host apparatus;
a second information table update part for updating said second information table, in a case where said first management part newly allocated a physical block to record said first information table;
a second management part for managing a physical block storing said second information table and recording data in the physical block in the second region of said nonvolatile memory in a rotational manner; and
a rewriting number conversion part for converting the number of times of update of the physical block storing said first information table from the time of manufacturing, the number being stored in said second information table, into the total number of times of rewriting of the first region of the nonvolatile memory,
the memory controller notifying to the host apparatus the total number of times of rewriting of the first region of said nonvolatile memory as the number of times of rewriting the nonvolatile memory.

2. The semiconductor recording device according to claim 1, wherein
each block of the plurality of physical blocks of said nonvolatile memory is composed of N (N is a natural number) pages,
said first information table is recorded in a physical block for the first information table allocated to the first region of said nonvolatile memory, and
said first information table is updated in units of pages every time a physical block to record the user data transferred from the host apparatus is allocated.

3. The semiconductor recording device according to claim 1, wherein
a number of physical blocks to be allocated to the second region of said nonvolatile memory is determined depending on reliability of the number of times of rewriting of an incorporated nonvolatile memory.

4. A memory controller which writes data in a nonvolatile memory having a first and a second regions in units of the physical blocks and reads the data from said nonvolatile memory, the memory controller being composed of a plurality of physical blocks, comprising:
an empty block management table for managing the physical block in said first region of said nonvolatile memory;
a first management part for upon receiving a writing command issued from the host apparatus, referring to said empty block management table and allocating a physical block to record the user data in said first region and for referring to said empty block management table and newly allocating the physical block, in a case of newly allocating a physical block storing a first information table that creates a correspondence relationship between a logical address issued by a host apparatus and a physical address in units of the physical blocks;
a first information table update part for updating said first information table, in a case of newly allocation a physical block to record the user data transferred from the host apparatus;
a second information table update part for updating said second information table composed of: a physical address of a physical block storing said first information table; and a number of times of update of the physical block storing said first information table from the time of manufacturing, in a case where said first management part newly allocated a physical block to record said first information table;
a second management part for managing a physical block storing said second information table and recording data in the physical block in the second region of said nonvolatile memory in a rotational manner; and
a rewriting number conversion part for converting the number of times of update of the physical block storing said first information table from the time of manufacturing, the number being stored in said second information table, into the total number of times of rewriting of the first region of the nonvolatile memory,
the memory controller notifying to the host apparatus the total number of times of rewriting of the first region of said nonvolatile memory as the number of times of rewriting the nonvolatile memory.

5. The memory controller according to claim 4, wherein
each block of the plurality of physical blocks of said nonvolatile memory is composed of N (N is a natural number) pages,
said first information table is recorded in the physical block for the first information table allocated to the first region of said nonvolatile memory, and
said first information table is updated in units of pages every time a physical block to record the user data transferred from the host apparatus is allocated.

6. The memory controller according to claim 4, wherein
a number of physical blocks to be allocated to the second region of said nonvolatile memory is determined depending on reliability of the number of times of rewriting of an incorporated nonvolatile memory.

7. A method for notifying the number of times of rewriting comprising steps of:
evenly recording: a first information table creating a correspondence relationship between a logical address issued by a host apparatus and a physical address in units of the physical blocks; and user data transferred from the host apparatus in a first region of a nonvolatile memory;
evenly recording a second information table composed of: a physical address of a physical block storing said first information table; and a number of times of update of the physical block storing said first information table from the time of manufacturing in a second region of said nonvolatile memory;
when the number of times of rewriting is requested from a host device, converting the number of times of update of the physical block storing said first information table from the time of manufacturing, the number being stored in said second information table, into the total number of times of rewriting of the first region of the nonvolatile memory; and
notifying the total number of times of rewriting of the first region of said nonvolatile memory as the number of times of rewriting the nonvolatile memory.

8. The method for notifying the number of times of rewriting according to claim 7, wherein
each block of the plurality of physical blocks of said nonvolatile memory is composed of N (N is a natural number) pages,
said first information table is recorded in the physical block for the first information table allocated to the first region of said nonvolatile memory, and
said first information table is updated in units of pages every time a physical block to record the user data transferred from the host apparatus is allocated.

9. The method for notifying the number of times of rewriting according to claim 7, wherein
a number of physical blocks to be allocated to the second region of said nonvolatile memory is determined depending on reliability of the number of times of rewriting of an incorporated nonvolatile memory.

10. A semiconductor recording device comprising:
at least one nonvolatile memory composed of a plurality of physical blocks; and
a memory controller for writing data in said nonvolatile memory and reading the data from said nonvolatile memory, wherein
said nonvolatile memory records:
a first information table for creating a correspondence relationship between a logical address issued by a host apparatus and a physical address in units of the physical blocks;
user data transferred from the host apparatus; and
a second information table composed of: a physical address of a physical block storing said first information table; and a number of times of update of the physical block storing said first information table from the time of manufacturing, and wherein
said memory controller includes:
an empty block management table for managing the physical block in the first region of said nonvolatile memory;
a physical block management part for upon receiving a writing command issued from the host apparatus, referring to said empty block management table and allocating a physical block to record the user data, and for referring to said empty block management table and newly allocating the physical block, in a case of newly allocating a physical block to store said first or said second information table;

a first information table update part for updating said first information table, in a case of newly allocation a physical block to record the user data transferred from the host apparatus;

a second information table update part for updating said second information table, in a case where said physical block management part newly allocated a physical block to record said first information table; and a rewriting number conversion part for converting the number of times of update of the physical block storing said first information table from the time of manufacturing, the number being stored in said second information table, into the total number of times of rewriting of the first region of the nonvolatile memory, the memory controller notifying to the host apparatus the total number of times of rewriting of said nonvolatile memory as the number of times of rewriting the nonvolatile memory.

11. The semiconductor recording device according to claim 10, wherein each block of the plurality of physical blocks of said nonvolatile memory is composed of N (N is a natural number) pages, and said first information table is updated in units of pages every time a physical block to record the user data transferred from the host apparatus is allocated.

12. A memory controller which writes data in a nonvolatile memory composed of a plurality of physical blocks and reads the data from said nonvolatile memory, comprising:

an empty block management table for managing the physical block of said nonvolatile memory;

a physical block management part for upon receiving a writing command issued from the host apparatus, referring to said empty block management table and allocating a physical block to record the user data, referring to said empty block management table and allocating a physical block storing a first information table that creates a correspondence relationship between a logical address issued by a host apparatus and a physical address in units of the physical blocks, and referring to said empty block management table and recording a second information table composed of: a physical address of a physical block storing said first information table; and a number of times of update of the physical block storing said first information table from the time of manufacturing;

a first information table update part for updating said first information table;

a second information table update part for updating said second information table in a case where said physical block management part newly allocated a physical block to record said first information table, a rewriting number conversion part for converting the number of times of update of the physical block storing said first information table from the time of manufacturing, the number being stored in said second information table, into the total number of times of rewriting of the first region of the nonvolatile memory, the memory controller notifying to the host apparatus the total number of times of rewriting of the first region of said nonvolatile memory as the number of times of rewriting the nonvolatile memory.

13. The memory controller according to claim 12, wherein each block of the plurality of physical blocks of said nonvolatile memory is composed of N (N is a natural number) pages, and said first information table is updated in units of pages every time a physical block to record the user data transferred from the host apparatus is allocated.

14. A method for notifying the number of times of rewriting comprising steps of:

recording: a first information table creating a correspondence relationship between a logical address issued by a host apparatus and a physical address in units of the physical blocks; a second information table composed of: a physical address of a physical block storing said first information table; and a number of times of update of the physical block storing said first information table from the time of manufacturing; and user data transferred from the host apparatus in a nonvolatile memory;

when the number of times of rewriting is requested from a host device, converting the number of times of update of the physical block storing said first information table from the time of manufacturing, the number being stored in said second information table, into the total number of times of rewriting of the first region of the nonvolatile memory; and notifying the total number of times of rewriting of the first region of said nonvolatile memory as the number of times of rewriting the nonvolatile memory.

15. The method for notifying the number of times of rewriting according to claim 14, wherein each block of the plurality of physical blocks of said nonvolatile memory is composed of N (N is a natural number) pages, and said first information table is updated in units of pages every time a physical block to record the user data transferred from the host apparatus is allocated.

* * * * *